US010529732B2

(12) United States Patent
Zhou et al.

(10) Patent No.: US 10,529,732 B2
(45) Date of Patent: Jan. 7, 2020

(54) METHOD FOR FORMING STAIRCASE STRUCTURE OF THREE-DIMENSIONAL MEMORY DEVICE

(71) Applicant: Yangtze Memory Technologies Co., Ltd., Wuhan, Hubei (CN)

(72) Inventors: Yu Ting Zhou, Hubei (CN); Li Hong Xiao, Hubei (CN); Jian Xu, Hubei (CN); Sizhe Li, Hubei (CN); Zhao Hui Tang, Hubei (CN); Zhaosong Li, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/046,627

(22) Filed: Jul. 26, 2018

(65) Prior Publication Data

US 2019/0326312 A1    Oct. 24, 2019

Related U.S. Application Data

(63) Continuation of application No. PCT/CN2018/083562, filed on Apr. 18, 2018.

(51) Int. Cl.
*H01L 27/11573* (2017.01)
*H01L 21/768* (2006.01)
(Continued)

(52) U.S. Cl.
CPC .. *H01L 27/11573* (2013.01); *H01L 21/76816* (2013.01); *H01L 21/76877* (2013.01);
(Continued)

(58) Field of Classification Search
None
See application file for complete search history.

(56) References Cited

U.S. PATENT DOCUMENTS

| 9,202,707 B2 | 12/2015 | Kawamata et al. |
| 9,472,422 B2 | 10/2016 | Hong |

(Continued)

FOREIGN PATENT DOCUMENTS

| CN | 104081502 A | 10/2014 |
| CN | 105514018 A | 4/2016 |

(Continued)

OTHER PUBLICATIONS

International Search Report and Written Opinion of the International Searching Authority directed to related International Patent Application No. PCT/CN2018/083562, dated Jan. 24, 2019; 8 pages.

*Primary Examiner* — Charles D Garber
*Assistant Examiner* — Steven M Christopher
(74) *Attorney, Agent, or Firm* — Sterne, Kessler, Goldstein & Fox, P.L.L.C.

(57) ABSTRACT

Embodiments of a method for forming a staircase structure of 3D memory devices are disclosed. The method comprises (i) forming an alternating layer stack including multiple layers disposed on a substrate in a vertical direction; (ii) removing a portion of the alternating layer stack to form multiple step-platforms in a staircase region of the alternating layer stack; (iii) forming a hard mask layer to cover top surfaces of the step-platforms; (iv) forming multiple openings in the hard mask layer to expose a portion of each of the step-platforms; (v) forming a photoresist layer to cover the top surfaces of the step-platforms and the hard mask layer; (vi) using a same set of trim-etch processes to pattern the photoresist layer to form a set of staircases on each of the step-platforms; (vii) removing the photoresist layer and the hard mask layer; and repeating (iii), (iv), (v), (vi) and (vii) sequentially.

15 Claims, 11 Drawing Sheets

(51) Int. Cl.
   *H01L 27/11529*   (2017.01)
   *H01L 27/11556*   (2017.01)
   *H01L 23/522*     (2006.01)
   *H01L 23/528*     (2006.01)
   *H01L 27/11582*   (2017.01)

(52) U.S. Cl.
   CPC ...... *H01L 23/5226* (2013.01); *H01L 23/5283* (2013.01); *H01L 27/11529* (2013.01); *H01L 27/11556* (2013.01); *H01L 27/11582* (2013.01)

(56) References Cited

U.S. PATENT DOCUMENTS

| | | |
|---|---|---|
| 9,741,563 B2 | 8/2017 | Xiang et al. |
| 2014/0363980 A1 | 12/2014 | Kawamata et al. |
| 2017/0207220 A1* | 7/2017 | Yun .................... H01L 27/1052 |
| 2018/0082940 A1 | 3/2018 | Sorensen et al. |
| 2018/0301372 A1* | 10/2018 | Noh .................. H01L 21/76816 |

FOREIGN PATENT DOCUMENTS

| | | |
|---|---|---|
| CN | 107591406 A | 1/2018 |
| CN | 107658224 A | 2/2018 |
| CN | 107863290 A | 3/2018 |
| KR | 2011/001691 A | 1/2011 |
| TW | 2014/28843 A | 7/2014 |
| TW | 2017/35158 A | 10/2017 |

* cited by examiner

METHOD FOR FORMING STAIRCASE STRUCTURE OF THREE-DIMENSIONAL MEMORY DEVICE

CROSS-REFERENCE TO RELATED APPLICATIONS

This application claims priority to PCT/CN2018/083562 filed on Apr. 18, 2018, the entire contents of which are incorporated herein by reference.

TECHNICAL FIELD

The present disclosure generally relates to the field of semiconductor technology, and more particularly, to a method for forming a staircase structure of three-dimensional (3D) memory devices.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. Three-dimensional (3D) memory architecture can address the density limitation in planar memory cells.

As semiconductor technology advances, 3D memory devices, such as 3D NAND memory devices, keep scaling more oxide/nitride (ON) layers. As a result, the existing multi-cycle trim and etch processes for forming the dual deck staircase structure (SS) suffer a low product throughput problem and consume an expensive fabricating cost.

BRIEF SUMMARY

Embodiments of a method for forming a staircase structure of 3D memory devices are disclosed herein.

Disclosed is a method for forming a staircase structure in a three-dimensional (3D) memory device. The method can comprise (i) forming an alternating layer stack including a plurality of layers disposed on a substrate in a vertical direction; (ii) removing a portion of the alternating layer stack to form a plurality of step-platforms in a staircase region of the alternating layer stack; (iii) forming a hard mask layer to cover top surfaces of the step-platforms; (iv) forming a plurality of openings in the hard mask layer to expose a portion of each of the step-platforms; (v) forming a photoresist layer to cover the top surfaces of the step-platforms and the hard mask layer; (vi) using a same set of trim-etch processes to pattern the photoresist layer to form a set of staircases on each of the step-platforms; (vii) removing the photoresist layer and the hard mask layer; and (viii) repeating (iii), (iv), (v), (vi) and (vii) sequentially.

In some embodiments, process (i) further includes forming an alternating layer stack including a plurality of dielectric layer pairs in the vertical direction, each dielectric layer pair including a first dielectric layer and a second dielectric layer.

In some embodiments, process (i) further includes forming an alternating layer stack including a plurality of dielectric layer pairs in the vertical direction, each dielectric layer pair including a silicon oxide layer and a silicon nitride layer.

In some embodiments, process (i) further includes forming an alternating layer stack including a plurality of dielectric/conductor layer pairs in the vertical direction.

In some embodiments, process (i) further includes forming an alternating layer stack including a plurality of dielectric/conductor layer pairs in the vertical direction, each dielectric/conductor layer pair including a silicon oxide layer and a tungsten layer.

In some embodiments, process (i) further includes forming an alternating layer stack including a number T of layers in the vertical direction, wherein T is equal to or larger than 64, and the alternating layer stack includes the staircase region having a width W in a lateral direction.

In some embodiments, process (ii) further includes removing a portion of the alternating layer stack to form a number x of step-platforms in the staircase region of the alternating layer stack, each step-platform having a number T/x of layers in the vertical direction and a width W/x in the lateral direction.

In some embodiments, process (iv) further includes forming a number x of openings in the hard mask layer to expose a portion of each of the step-platforms. A width of each opening substantially equals to $n \times m \times W/T$, n being a number of layers in each staircase to be formed and m being a number of staircases to be formed in each opening.

In some embodiments, process (iii) further includes forming a polysilicon layer to cover top surfaces of the step-platforms as the hard mask layer.

In some embodiments, process (vi) further includes patterning the photoresist layer to expose a portion of a top surface of each step-platform; removing at least two top layers of the alternating layer stack exposed by the photoresist layer on each step-platform; and trimming the photoresist layer to expose a larger portion of the top surface of each step-platform.

In some embodiments, process (vi) further includes patterning the photoresist layer to expose a portion of a top surface of each step-platform, wherein a width of the portion substantially equals to $n \times W/T$.

In some embodiments, process (vi) further includes removing a first layer of the alternating layer stack on each step-platform by using the photoresist layer as a mask; and removing a second layer of the alternating layer stack on each step-platform by using the first layer as a mask.

In some embodiments, process (vi) further includes trimming the photoresist layer to expose a larger portion of the top surface of each step-platform, wherein a width of the larger portion substantially equals to $2n \times W/T$.

In some embodiments, process (viii) further includes: forming a second hard mask layer to cover top surfaces of the remaining alternating layer stack; forming a plurality of second openings in the hard mask layer to expose a larger portion of each of the step-platforms; forming a second photoresist layer to cover the exposed surfaces of the step-platforms and the second hard mask layer; using a second same set of trim-etch processes to pattern the photoresist layer to form another set of staircases on each of the step-platforms; and removing the second photoresist layer and the second hard mask layer.

In some embodiments, forming the plurality of second openings includes forming a number x of second openings in the second hard mask layer to expose a larger portion of each of the step-platforms. A width of each second opening substantially equals to $2n \times m \times W/T$.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
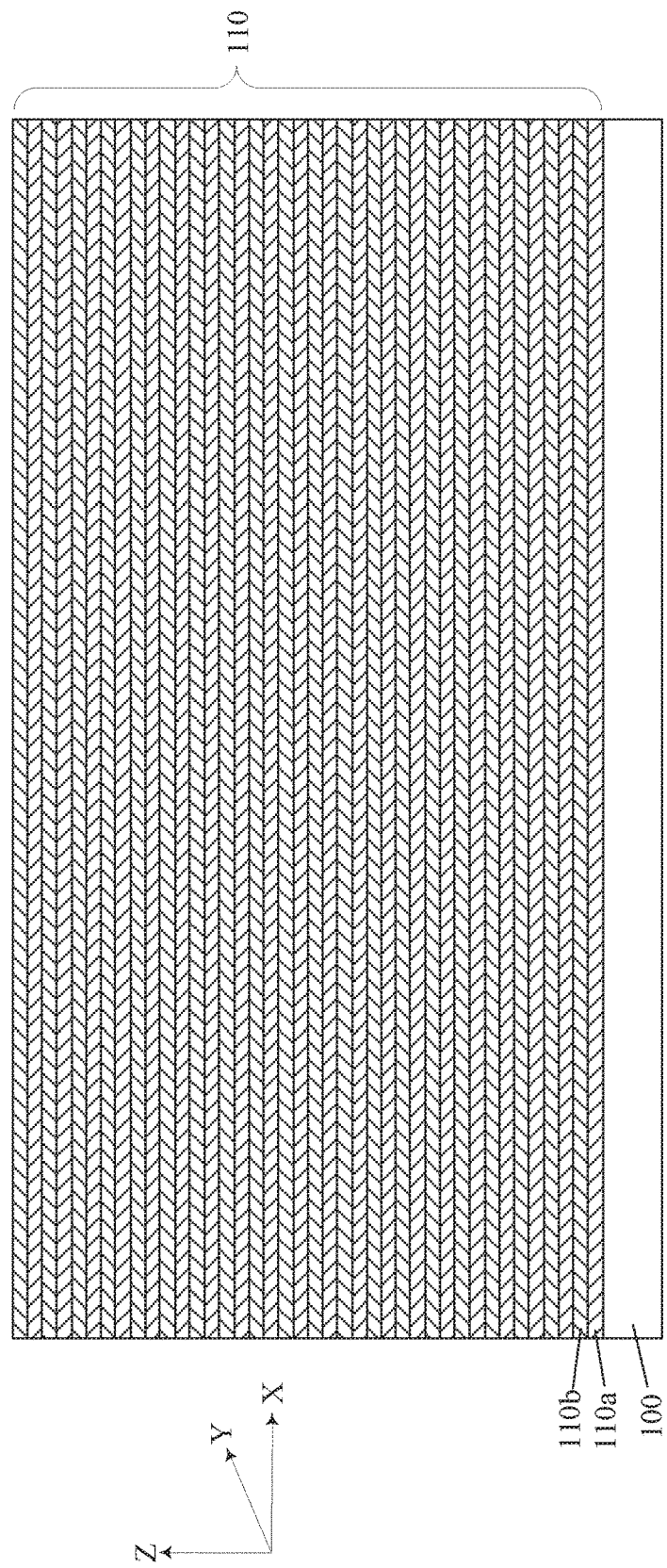
FIGS. 1-10 illustrate schematic cross-sectional views of a staircase region of an exemplary 3D memory device at certain fabricating stages in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

Various embodiments in accordance with the present disclosure provide a method for forming staircase structures of 3D memory devices. As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

In some embodiments, a NAND string includes a semiconductor channel (e.g., a silicon channel) that extends vertically through a plurality conductor/dielectric layer pairs. The plurality of conductor/dielectric layer pairs are also referred to herein as an "alternating conductor/dielectric stack." The conductor layer of the alternating conductor/dielectric stack can be used as a word line (electrically connecting one or more control gates). Vertically-oriented memory strings require an electrical connection between the conductive materials (e.g., word line plates or control gates)

and access lines (e.g., word lines) so that memory cells in the 3D memory device may be uniquely selected for writing or reading functions.

One method of forming an electrical connection includes forming a staircase structure (SS) at the edge of the alternating conductor/dielectric stack. As the desired number of the conductive/dielectric pairs in the alternating conductor/dielectric stack increases, the margin of error associated with each act in the process of forming the staircases correspondingly decreases.

The conventional methods for forming the staircase structure include multi-cycle trim and etch processes. Each iteration of the conventional method includes trimming the mask, etching the insulating material, and etching the conductive material. The desired number of staircases is formed by repeating these actions as many times as the number of conductive materials in the stack. Each action of the conventional methods has an associated etch control error because the size of each staircase is designed to fall within a particular range (e.g., tolerance) to allow enough room for a contact to be formed thereon while keeping the overall size of the staircase structure small.

Additionally, the relative locations of the staircases are designed to fall within a range of locations in order to accurately form contacts thereon. As the number of iterations increases, any deviation from a target staircase width or location may be compounded because errors in one material are transferred to an underlying material. For a larger number of staircases (e.g., 64, 96, 128, etc.) in the staircase structure, the margin of error to be achieved for the etch rate control may be very small (e.g., less than 0.5%). Small margins of error are difficult and costly to attain using conventional methods.

Furthermore, because the mask is repeatedly trimmed, the conventional method may start with a mask of high thickness, which may be difficult to repeatedly pattern and trim with the precision needed to have the necessary control over staircase width. Alternatively, the conventional method may use a unique mask for each etch act to form the staircases, which requires significant cost because the large amount of photolithographic reticles used to form the masks is expensive and the fabrications of a large number of masks are time-consuming.

The disclosed method for forming the staircase structure of 3D memory devices, including staircase region overall division, hard-mask poly deposition, and multi-cycle trim and etch processes, can significantly reduce the fabricating cost and improve product throughput by decreasing the cycle time and the number of masks. In some embodiments, staircase division pattern (SDP) of the staircase region can be applied into different directions and different decks with trim-etch processes.

Figure 9:
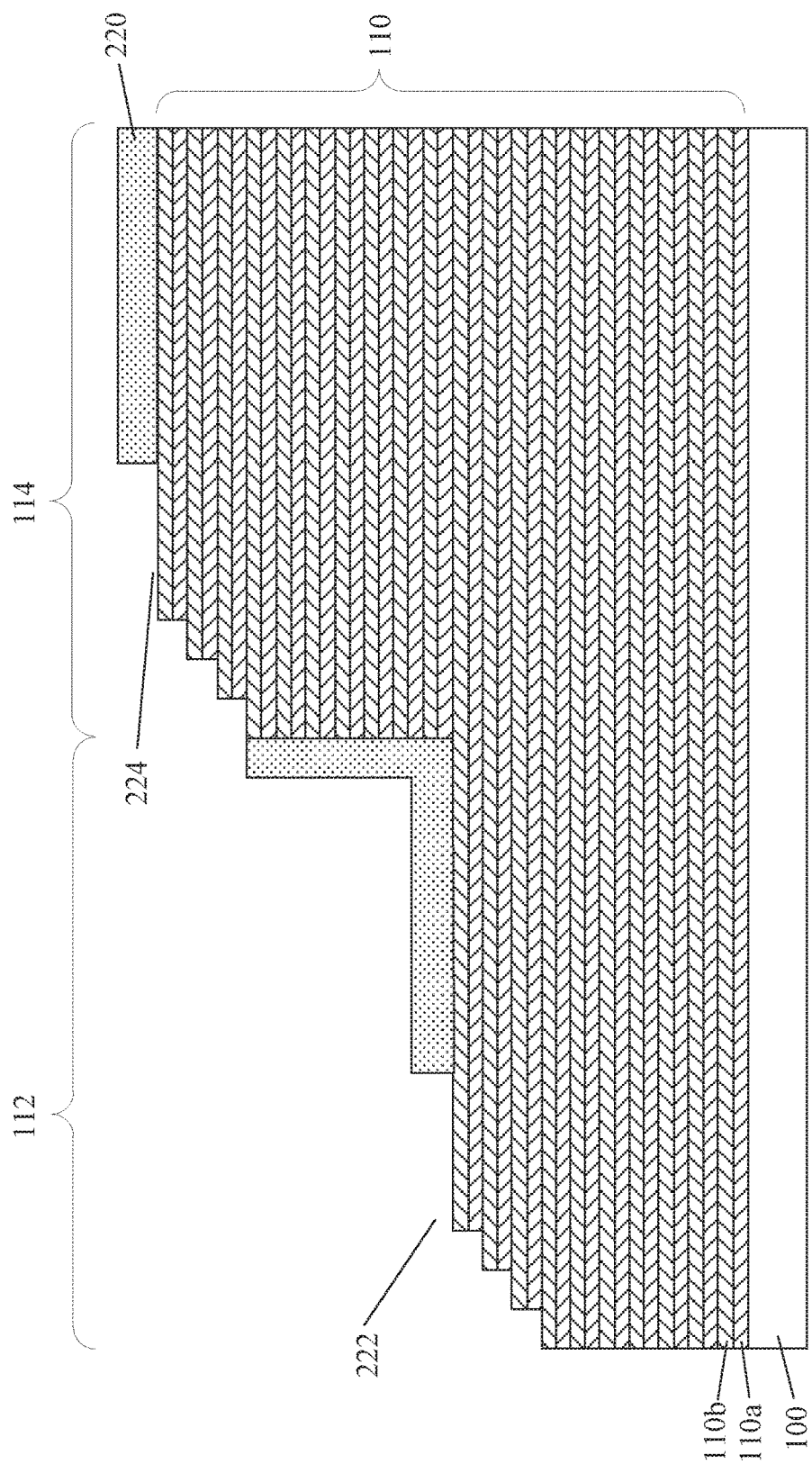
Figure 10:
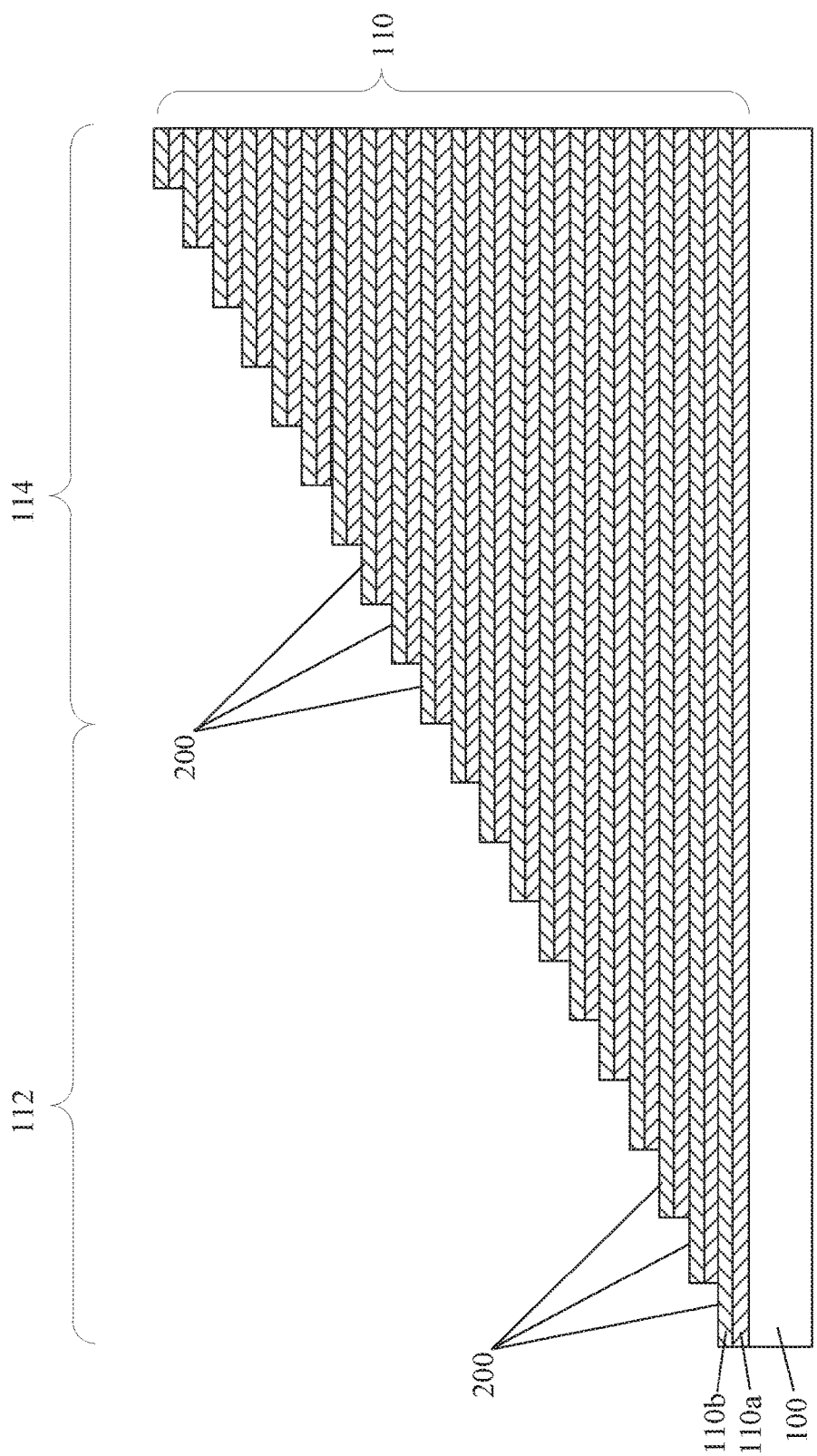
Figure 11:
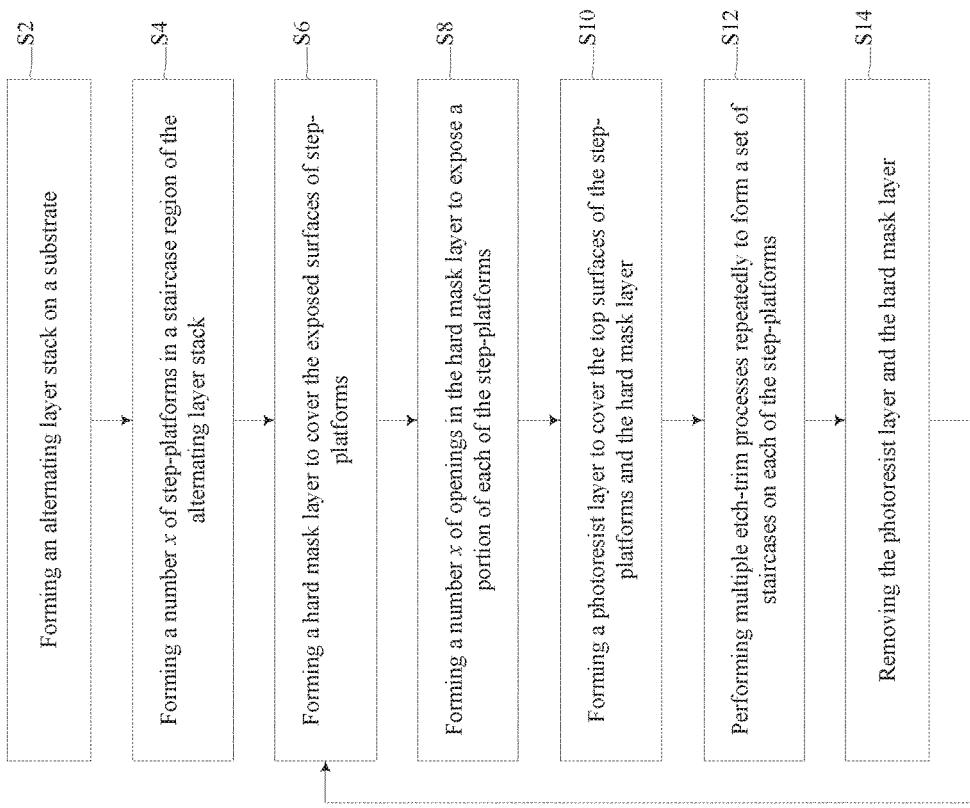
FIG. 11 illustrates a flow diagram of an exemplary method for forming a staircase structure of a 3D memory device in accordance with some embodiments of the present disclosure.

Referring to FIG. 11, a flow diagram of an exemplary method for forming a staircase structure of a 3D memory device is illustrated in accordance with some embodiments of the present disclosure. FIGS. 1-10 illustrate schematic cross-sectional views of a staircase region of an exemplary 3D memory device at certain fabricating stages of the method shown in FIG. 11.

As shown in FIG. 11, the method starts at operation S2, in which an alternating layer stack is formed on a substrate. In some embodiments, the substrate can be any suitable semiconductor substrate having any suitable structure, such as a monocrystalline single-layer substrate, a polycrystalline silicon (polysilicon) single-layer substrate, a polysilicon and metal multi-layer substrate, etc.

As shown in FIG. 1, an alternating layer stack 110 can be formed on the substrate 100. The alternating layer stack 110 can be either an alternating dielectric stack 110 or an alternating conductor/dielectric stack 110. It is noted that, the X-, Y- and Z-directions are illustrated for ease of description in the subsequent processes.

In some embodiments, the alternating dielectric stack 110 can include a plurality of dielectric layer pairs arranged in a vertical direction that is perpendicular to the surface of the substrate. Each dielectric layer pair can include a first dielectric layer 110a and a second dielectric layer 110b that is different from first dielectric layer. The plurality of first dielectric layers 110a and second dielectric layers 110b are extended in a lateral direction that is parallel to a surface of the substrate 100. In some embodiments, there are more layers than the dielectric layer pairs made of different materials and with different thicknesses in the alternating dielectric stack 110. The alternating dielectric stack 110 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the alternating dielectric stack 110 can include a plurality of oxide/nitride layer pairs. Each dielectric layer pair includes an oxide layer 110a (e.g., silicon oxide layer) and a nitride layer 110b (e.g., silicon nitride layer). The plurality of oxide/nitride layer pairs are also referred to herein as an "alternating oxide/nitride stack." That is, in the alternating dielectric stack 100, multiple oxide layers 110a and multiple nitride layers 110b alternate in the vertical direction. In other words, except a top and a bottom layer of a given alternating oxide/nitride stack, each of the other oxide layers 110a can be sandwiched by two adjacent nitride layers 110b, and each of the nitride layers 110b can be sandwiched by two adjacent oxide layers 110a.

Oxide layers 110a can each have the same thickness or have different thicknesses. For example, a thickness of each oxide layer can be in a range from 90 nm to 160 nm, preferably about 150 nm. Similarly, nitride layers 110b can each have the same thickness or have different thicknesses. For example, a thickness of each nitride layer can be in a range from 80 nm to 110 nm, preferably about 100 nm.

It is noted that, in the present disclosure, the oxide layers 110a and/or nitride layers 110b can include any suitable oxide materials and/or nitride materials. For example, the oxide layers can be silicon oxide layers, and the nitride layers can be silicon nitride layer. The alternating dielectric stack 110 can include any suitable number of layers of the oxide layers 110a and the nitride layers 110b. In some embodiments, a total number of layers T of the oxide layers 110a and the nitride layers 110b in the alternating dielectric stack 110 is equal to or larger than 64. For example, the number T can be 64, 96, 128, etc. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair.

In some embodiments, a gate replacement process can be performed to replace second dielectric layers 110b (e.g., silicon nitride) of the alternating dielectric stack 110 with conductive layers. In some embodiment, the element of the conductive layers can include, but not limited to, tungsten (W), cobalt (Co), copper (Cu), aluminum (Al), doped silicon, silicides, or any combination thereof. As a result, after the gate replacement process, the alternating dielectric stack 110 becomes the alternating conductor/dielectric stack 110. The replacement of second dielectric layers 110b with conductive layers can be performed by wet etching second dielectric layers 110b (e.g., silicon nitride) selective to first dielectric layers 110a (e.g., silicon oxide) and filling the structure with conductive layers (e.g., W). Conductive layers can be filled by PVD, CVD, ALD, any other suitable process, or any combination thereof. Conductive layers can include conductive materials including, but not limited to, W, Co, Cu, Al, polysilicon, silicides, or any combination thereof. As such, the formed alternating conductor/dielectric stack 110 can include a plurality of conductor/dielectric/layer pairs.

As shown in FIG. 11, the method processes to operation S4, in which two or more step-platforms can be formed in a staircase region of the alternating layer stack. In some embodiments, a number x of step-platforms can be formed in the staircase region of the alternating layer stack. The number x of step-platforms can have a substantially equal width. That is, when the total width of the staircase region of the alternating layer stack is W, the width of each of the number x of step-platforms can substantially equal to W/x. In the following description of the present disclosure and the corresponding figures, the number x is selected as two as a simplest example for description purpose. It is noted that, the number x can be any suitable integer that can be determined by a total number T of layers in the alternating layer stack and a layer number n in each staircase to be formed.

Figure 2:
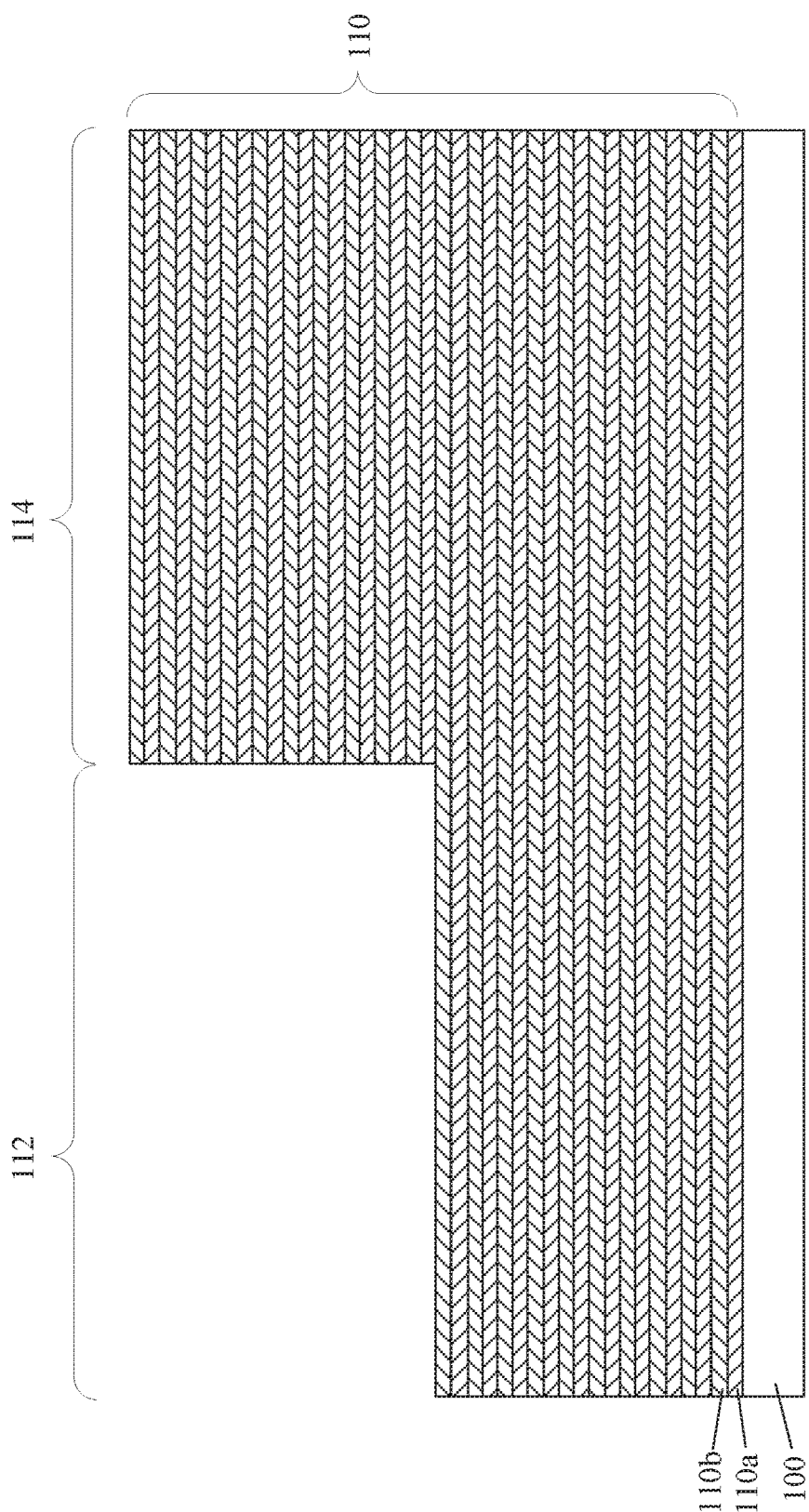

As shown in FIG. 2, the staircase region of the alternating layer stack 110 can be divided into two or even more sub-regions in the lateral direction, e.g., a first sub-region 112 at the edge of the alternating layer stack 110, and a second sub-region 114 that is connected to a core array region (not shown in the figures) of the 3D memory device. The width of the first sub-region 112 and the width of the second sub-region 114 can be substantially equal to each other, that is, substantially equal to a half of the total width W of the staircase region of the alternating layer stack 110.

In operation S4, a half depth of the first sub-region 112 in the vertical direction can be removed. For example, when the alternating layer stack 110 has a number T of the layers (T is an even number as described above), a number T/2 of layers can be removed in the first sub-region 112 as shown in FIG. 2. In some embodiments, one or more wet etch processes, dry etch processes, or combinations thereof can be used to remove the half depth of the first sub-region 112. As such, two step-platforms 112 and 114 are formed in the staircase region of the alternating layer stack 110, each having a width W/2.

Figure 3:
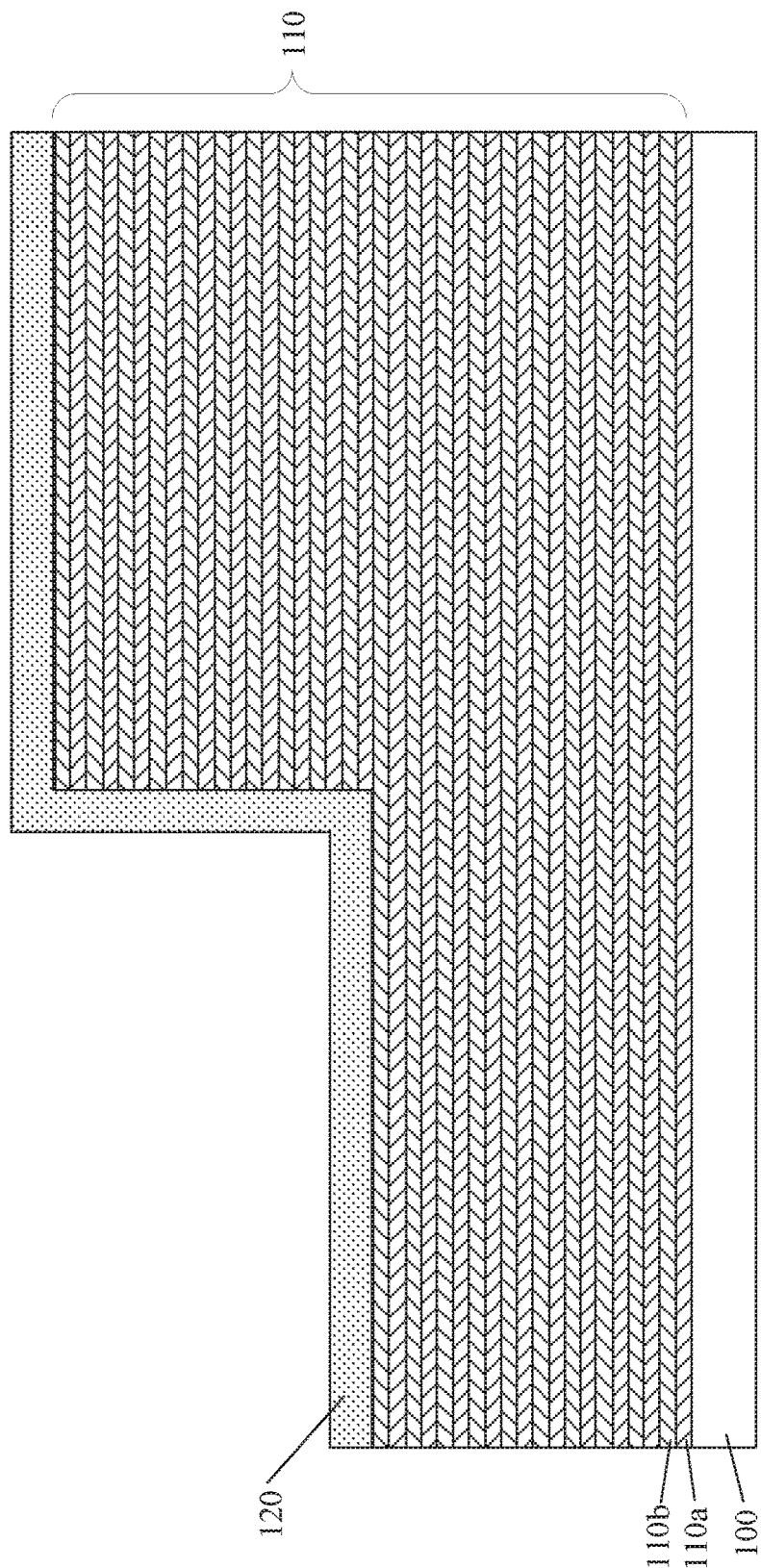

As shown in FIG. 11, the method processes to operation S6, in which a hard mask layer can be formed to cover the exposed surfaces of the alternating layer stack. As shown in FIG. 3, the hard mask layer 120 can be formed to cover the top surfaces of the two step-platforms of the alternating layer stack 110, and the side wall of the alternating layer stack 110 at the boundary of the two step-platforms. In some embodiments, the hard mask layer can be a polysilicon layer formed by any suitable deposition process, such as CVD, PVD, ALD, etc.

Figure 4:
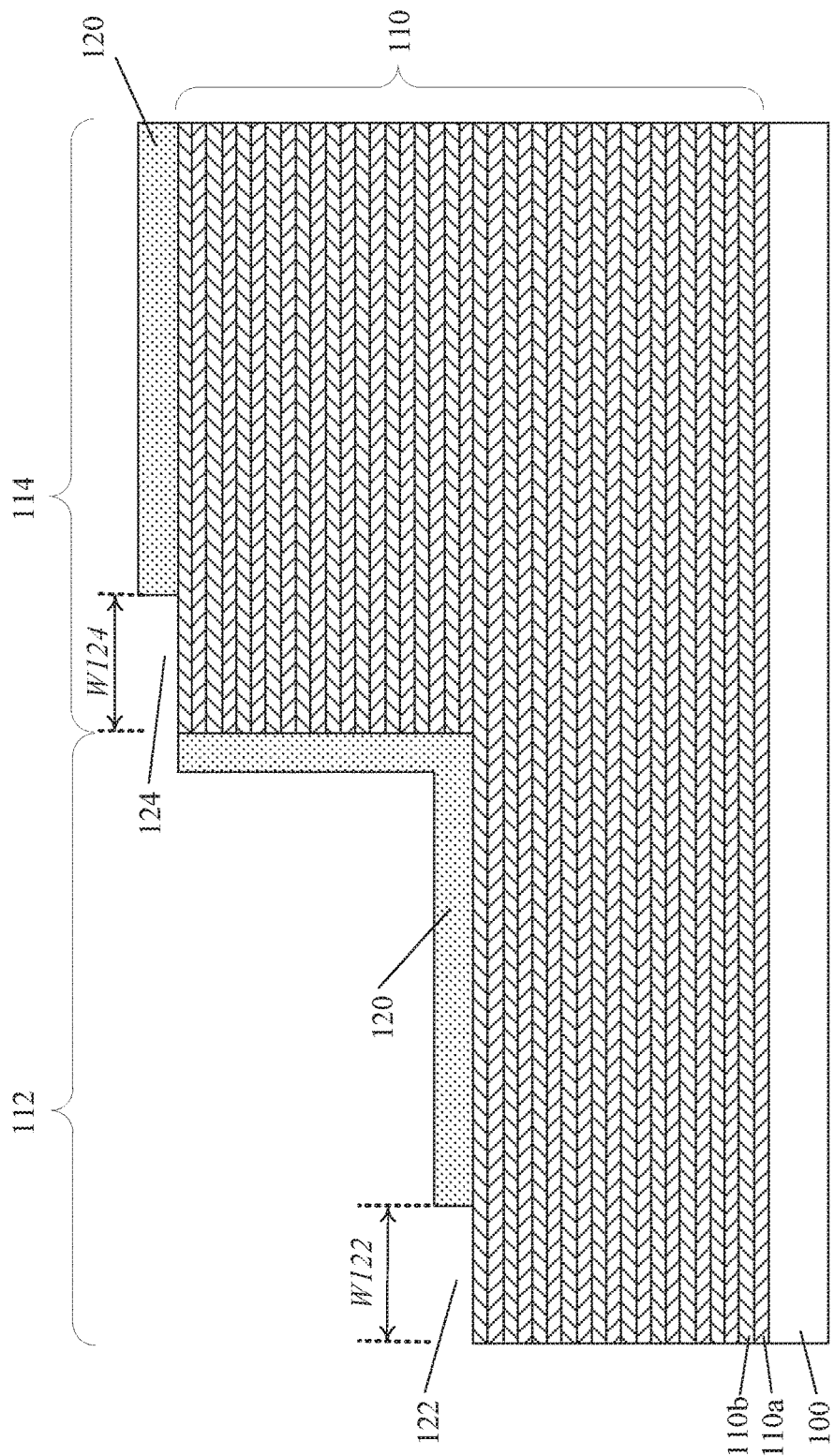

As shown in FIG. 11, the method processes to operation S8, in which two or more openings can be formed in the hard mask layer to expose a portion of each of the two or more step-platforms of the alternating layer stack. As shown in FIG. 4, still using two openings as an example. A first opening 122 can be formed in the first step-platform 112 at the edge of the alternating layer stack 110, and a second opening 124 can be formed in the second step-platform 124 adjacent to the boundary between the first step-platform 112 and the second step-platform 114.

The first opening 122 and the second opening 124 can be formed by removing a portion of the hard mask layer 120 using any suitable removal processes, including, but not limited to, patterning process, etching process, cleaning process, etc. A width W122 of the first opening 122 and a width W124 of the second opening 124 can be substantially equal to each other. In some embodiments, the width W122 of the first opening 122 and the width W124 of the second opening 124 can be substantially equal to n×m×W/T, where W is the total width of the staircase region of the alternating layer stack 110, T is the total layer numbers of the alternating layer stack 110, n is the layer numbers in each staircase to be formed, m is the number of staircases to be formed in the first opening 122 or the second opening 124.

Figure 5:
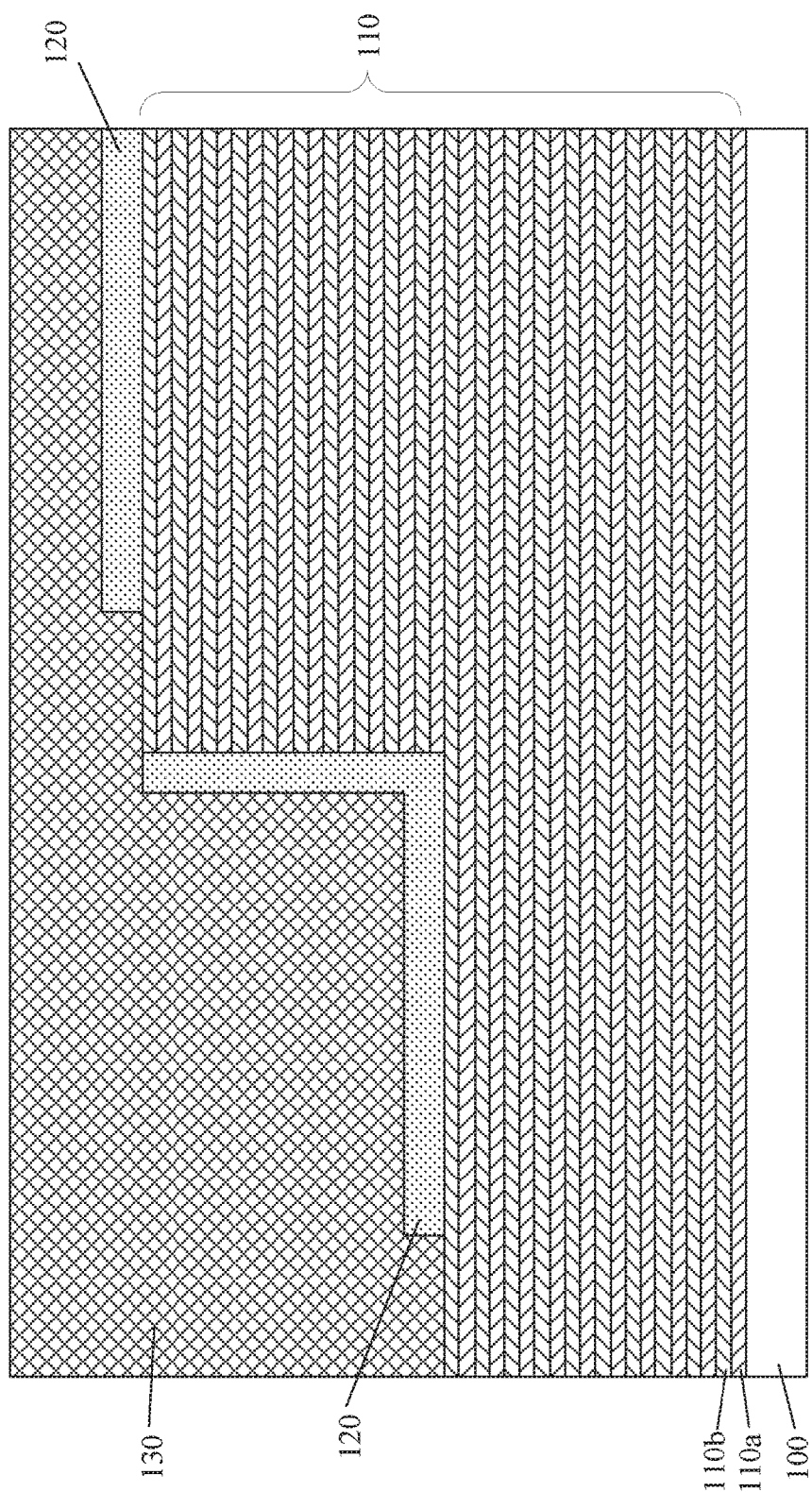

As shown in FIG. 11, the method processes to operation S10, in which a photoresist layer can be formed to cover the top surfaces of the alternating layer stack and the hard mask layer. As shown in FIG. 5, a photoresist layer 130 can be formed by using a spin-on coating process to cover the top surfaces of the alternating layer stack 110 and the hard mask layer 120. A top surface of the photoresist layer 130 can be substantially flat in a lateral direction. The material of the photoresist layer 130 can include any suitable light-sensitive material, such as photo polymeric material, photo decomposing material, photo crosslinking material, etc.

Figure 6:
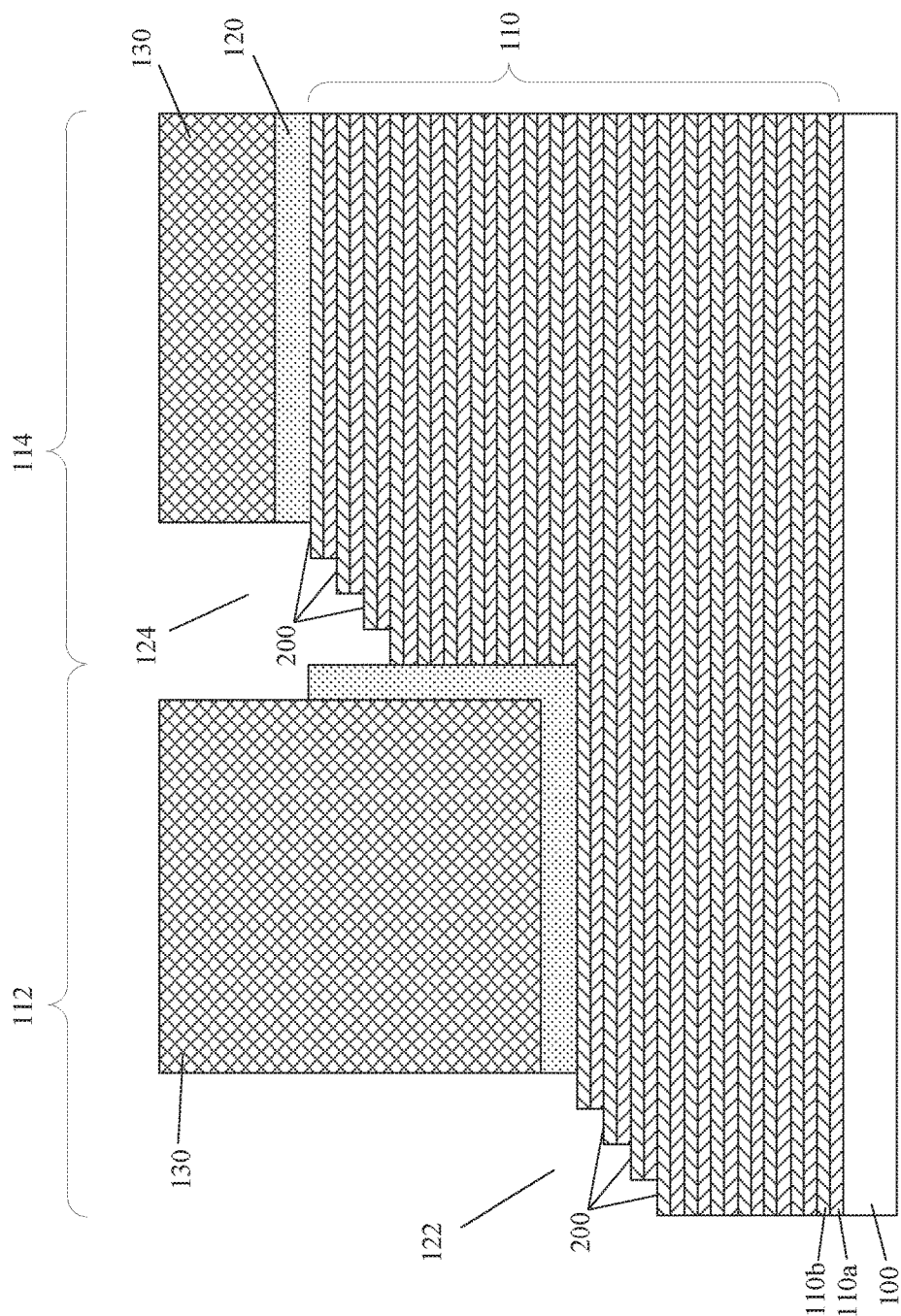

As shown in FIG. 11, the method processes to operation S12, in which multiple etch-trim processes can be performed repeatedly to form a set of staircases in each of the two or more openings. In some embodiments, the etch-trim processes can include a same or different (when necessary) set of repeating etch-trim processes to form two sets of in two or more step-platforms of the alternating layer stack, e.g., the first step-platform 112 exposed by the first opening 122 and the second step-platform 114 exposed by the second opening 124 as shown in FIG. 6. For example, the "same set" of etch-trim processes can include a first etch-trim process to form first staircases in the first region and the second region simultaneously, a second etch-trim process to form second staircases in the first region and the second region simultaneously, and so on.

In some embodiments, it is noted that as more and more staircases are formed from top of alternating film stack 110 down to the bottom substrate 100, the multiple etch-trim process is not only performed along X-direction (as shown in FIG. 5) with the staircase division pattern (SDP), a multi-lane process divided by another staircase division pattern can be also performed in Y-direction.

Specifically, as shown in FIG. 6, the photoresist layer 130 can be used as a mask to be patterned to expose a portion of the top surface of the alternating layer stack 100 in each of the first opening 122 and the second opening 124. A width of the exposed top surface of the first step-platform 112, and/or a width of the exposed top surface of the second step-platform 114, which is so-called one "step width" of the staircase structure, can be substantially equal to n×W/T, where W is the total width of the staircase region of the alternating layer stack 110, T is the total layer numbers of the alternating layer stack 110, n is the layer numbers in each staircase to be formed.

In some embodiments, an anisotropic etching process, such as a reactive ion etching (RIE) process, or other suitable dry/wet etching process, can be performed to remove the exposed layers (e.g., the second dielectric layers 110b) of the first step-platform 112 and the second step-platform 114 that are exposed through the mask (i.e., the photoresist layer 130). The pattern in the mask (i.e., the photoresist layer 130) is then transferred to the layers (e.g., the second dielectric layers 110b) that have been etched. The exposed layers (e.g., the second dielectric layers 110b) of the first step-platform 112 and the second step-platform 114 can be removed by one dry etching process that stops on the next lower layers (e.g., the first dielectric layers 110a), and the exposed next lower layers (e.g., the first dielectric layers 110a) can be then removed by another dry etching process that stops on the next lower layers (e.g., the second dielectric layers 110b). The two-step etching processes can be repeated n/2 times, where n is an even number representing the layer numbers in each staircase. As such, two staircases can be simultaneously formed, in which one is in the first opening 122 and the other is in the second opening 124.

Next, the mask (i.e., the photoresist layer 130) can be reduced in size by removing a portion of the mask (also known as "trimming") above the first step-platform 112 and the second step-platform 114, such as by an isotropic etching process, to expose another step width of the first step-platform 112 and another step width of the second step-platform 114. The method can repeated by subjecting the structure to an anisotropic etching process, including removing exposed portions of the two exposed layers of the first step-platform 112 and the second step-platform 114 (e.g., the second dielectric layers 110b), and subsequently removing exposed portions of the two exposed next lower layers (e.g., the second dielectric layers 110b). The two-step etching processes can be repeated n/2 times, such that two staircases can be formed in the first opening 122 while two staircases can be formed in the second opening 124.

In some embodiments, the successive reduction in size of the mask (i.e., the photoresist layer 130) and the repeated etching processes can be repeated m times until the hard mask layer 120 is exposed. As such, a same number of staircases 200 can be formed in both of the first opening 122 and the second opening 124. In some embodiments, a number m of staircases can be formed in the first opening 122 and a number m of staircases can be formed in the second opening 124. Each staircase can include number n of layers, and each staircase has a step width that is substantially equal to n×W/T, where W is the total width of the staircase region of the alternating layer stack 110, T is the total layer numbers of the alternating layer stack 110. For example, FIG. 6 shows four staircases 200 formed in the first opening 122 and four staircases 200 formed in the second opening 124. Each staircase includes two layers, i.e., a first dielectric layer 110a (e.g., silicon oxide layer) in the bottom and a second dielectric layer 110b (silicon nitride layer) in the top, or a dielectric layer 110a (e.g., silicon oxide layer) in the bottom and a conductor layer 110b (e.g., tungsten layer) in the top.

Figure 7:
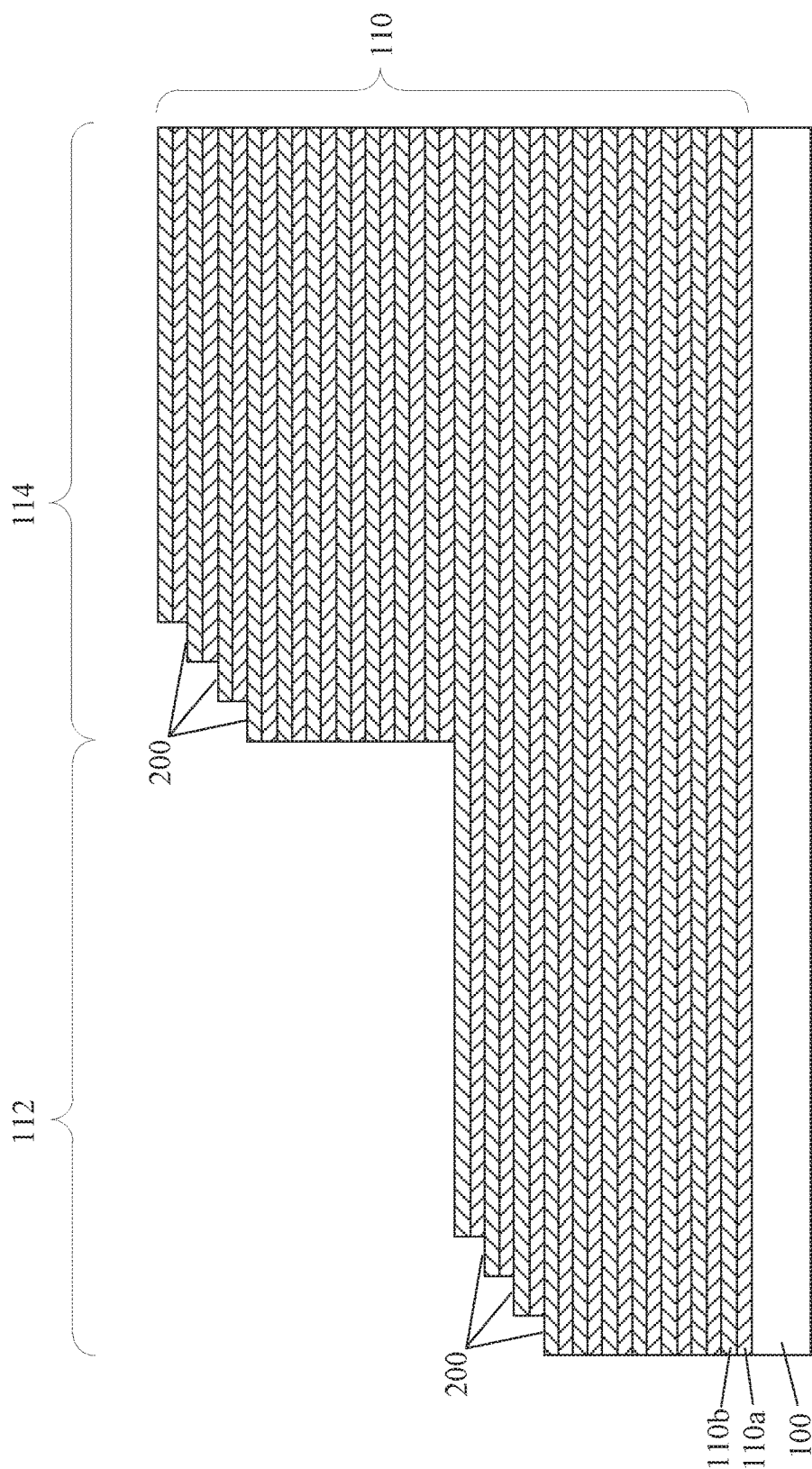

As shown in FIG. 11, the method processes to operation S14, in which the photoresist layer and the hard mask layer can be removed. In some embodiments, the removal process can include any suitable etching processes and cleaning processes. As shown in FIG. 7, the photoresist layer 130 and the hard mask layer 120 can be removed. The remaining portion of the alternating layer stack 110 can include same number of staircases 200 in the first sub-region 112 and the second sub-region 114.

Figure 8:
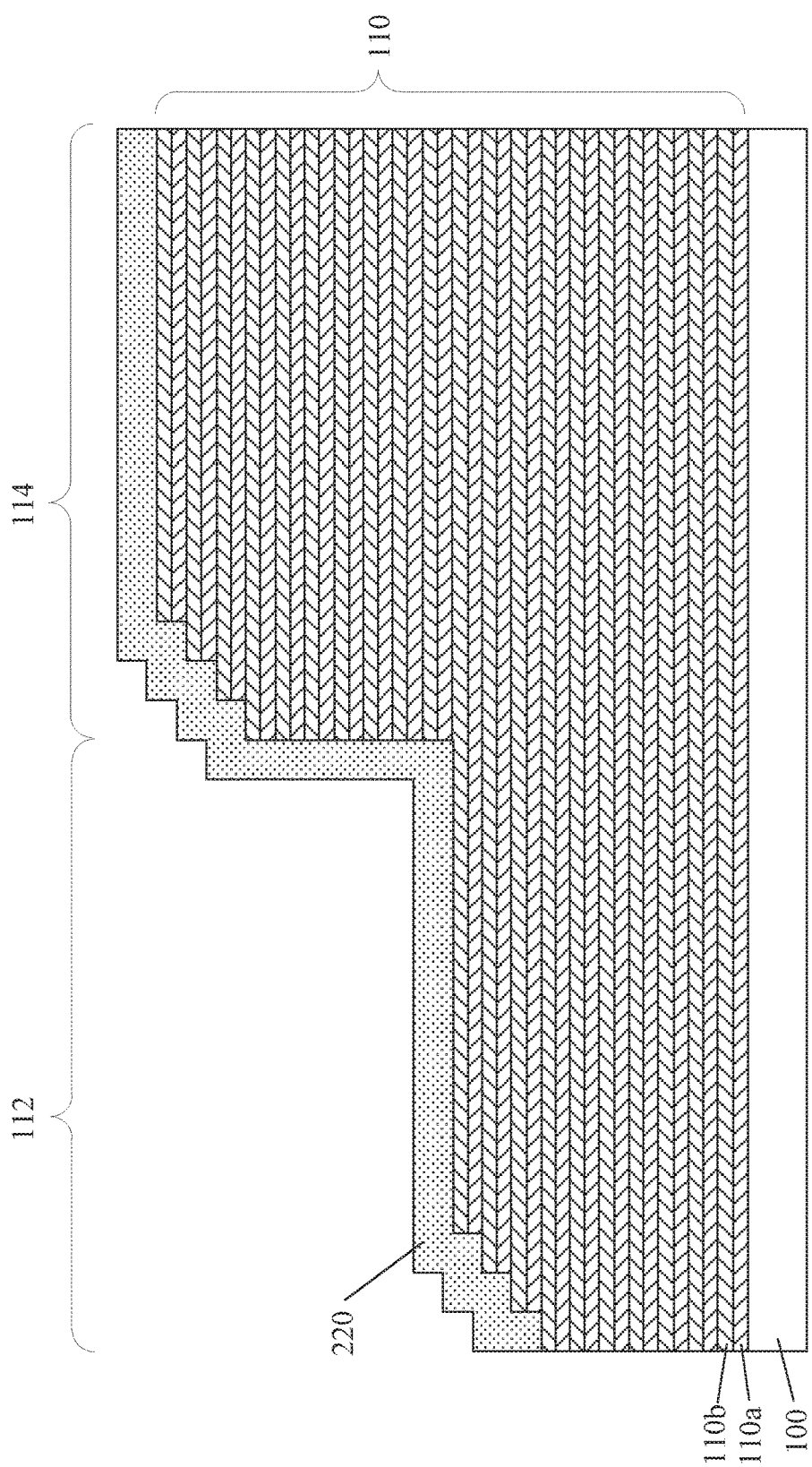

As shown in FIG. 11, the method processes back to operation S6, in which another hard mask layer 220 can be formed to cover the exposed surfaces of the alternating layer stack 110, as shown in FIG. 8. Then at operation S8, two larger openings 222 and 224 can be formed in the hard mask layer 220 to expose a larger portion of each of the two sub-regions of the alternating layer stack 110, as shown in FIG. 9. Next, the method can further process to the above described operations S10, S12 and S14 sequentially. The method can repeat the above operations S6-S14 until the formed staircases in the first sub-region 112 being connected to the formed staircases in the second sub-region 114, as shown in FIG. 10. As such, the staircase structure of the alternating layer stack 110 can be completely formed.

By using the disclosed method to form the staircase structure in the 3D memory device, a number of required photo masks can be significantly reduced, thereby reducing the fabricating cost and manufacturing period. It is noted that, since the alternating layer stack is divided into two or more sub-regions in the disclosed method, the method is suitable for dual or multiple deck alternating layer stack structure. The upper deck staircase structure and the lower deck staircase structure can be formed together within the same trim-etch cycles. Thus, the process time can be reduced and the product throughput can be increased. Further, the method can be applied to multi-deck alternating layer stack structure by forming multiple step-platforms in the staircase region of the alternating layer stack in operation S4 as described above. As such, the staircase structure can be formed in each of the multiple decks of the alternating layer stack together within the same trim-etch cycles.

Accordingly, a method for forming a staircase structure in a three-dimensional (3D) memory device is provided in some embodiments of the present disclosure. The method can includes: (i) forming an alternating layer stack including a plurality of layers disposed on a substrate in a vertical direction; (ii) removing a portion of the alternating layer stack to form a plurality of step-platforms in a staircase region of the alternating layer stack; (iii) forming a hard mask layer (e.g., a polysilicon layer) to cover top surfaces of the step-platforms; (iv) forming a plurality of openings in the hard mask layer to expose a portion of each of the step-platforms; (v) forming a photoresist layer to cover the top surfaces of the step-platforms and the hard mask layer; (vi) using a same set of trim-etch processes to pattern the photoresist layer to form a set of staircases on each of the step-platforms; (vii) removing the photoresist layer and the hard mask layer; and (viii) repeating (iii), (iv), (v), (vi) and (vii) sequentially.

In some embodiments, the alternating layer stack includes a plurality of dielectric layer pairs, each dielectric layer pair including a first dielectric layer and a second dielectric layer, such as a silicon oxide layer and a silicon nitride layer. In some other embodiments, the alternating layer stack includes a plurality of dielectric/conductor layer pairs in a vertical direction, each dielectric/conductor layer pair including a dielectric layer and a metal layer, such as a silicon oxide layer and a tungsten layer.

In some embodiments, the alternating layer stack including a number T of layers in a vertical direction, T being equal to or larger than 64. The alternating layer stack includes the staircase region having a width W in a lateral direction. A number x of step-platforms can be formed in the staircase region by removing a portion of the alternating layer stack. Each step-platform can have a number T/x of layers in the vertical direction and a width W/x in the lateral direction.

In some embodiments, a number x of openings can be formed in the hard mask layer to expose a portion of each of the step-platforms. A width of each opening substantially equals to n×m×W/T, n being a number of layers in each staircase to be formed and m being a number of staircases to be formed in each opening.

In some embodiments, operation (vi) (the trim-etch processes) further includes patterning the photoresist layer to expose a portion of a top surface of each step-platform. A width of the portion substantially equals to n×W/T. Operation (vi) further includes removing a first layer of the alternating layer stack on each step-platform by using the photoresist layer as a mask, and removing a second layer of the alternating layer stack on each step-platform by using the first layer as a mask. In some embodiments, operation (vi) further includes trimming the photoresist layer to expose a larger portion of the top surface of each step-platform. A width of the larger portion substantially equals to 2n×W/T.

In some embodiments, the repeating operation (viii) further includes: forming a second hard mask layer to cover top surfaces of the remaining alternating layer stack; forming a plurality of second openings in the hard mask layer to expose a larger portion of each of the step-platforms; forming a second photoresist layer to cover the exposed surfaces of the step-platforms and the second hard mask layer; using a same set of trim-etch processes to pattern the photoresist layer to form another set of staircases on each of the step-platforms; and removing the second photoresist layer and the second hard mask layer. In some embodiments, a number x of second openings can be formed in the second hard mask layer to expose a larger portion of each of the step-platforms. A width of each second opening substantially equals to 2n×m×W/T.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a staircase structure in a three-dimensional (3D) memory device, comprising:
(i) forming an alternating layer stack including a plurality of layers disposed on a substrate in a vertical direction;
(ii) removing a portion of the alternating layer stack to form a plurality of step-platforms in a staircase region of the alternating layer stack, wherein a top surface of each step-platform is not coplanar with any top surfaces of other step-platforms;
(iii) forming a hard mask layer to cover top surfaces of the step-platforms;
(iv) forming a plurality of openings in the hard mask layer to expose a portion of each of the step-platforms;
(v) forming a photoresist layer to cover the top surfaces of the step-platforms and the hard mask layer;
(vi) using a same set of trim-etch processes to pattern the photoresist layer to form a set of staircases in each of the step-platforms;
(vii) removing the photoresist layer and the hard mask layer; and
(viii) repeating (iii), (iv), (v), (vi) and (vii) sequentially.

2. The method of claim 1, wherein (i) further includes:
forming an alternating layer stack including a plurality of dielectric layer pairs in the vertical direction, each dielectric layer pair including a first dielectric layer and a second dielectric layer.

3. The method of claim 2, wherein (i) further includes:
forming an alternating layer stack including a plurality of dielectric layer pairs in the vertical direction, each dielectric layer pair including a silicon oxide layer and a silicon nitride layer.

4. The method of claim 1, wherein (i) further includes:
forming an alternating layer stack including a plurality of dielectric/conductor layer pairs in the vertical direction.

5. The method of claim 4, wherein (i) further includes:
forming an alternating layer stack including a plurality of dielectric/conductor layer pairs in the vertical direction, each dielectric/conductor layer pair including a silicon oxide layer and a tungsten layer.

6. The method of claim 1, wherein (i) further includes:
forming an alternating layer stack including a number T of layers in the vertical direction, wherein T is equal to or larger than 64, and the alternating layer stack includes the staircase region having a width W in a lateral direction.

7. The method of claim 6, wherein (ii) further includes:
removing a portion of the alternating layer stack to form a number x of step-platforms in the staircase region of the alternating layer stack, each step-platform having a number T/x of layers in the vertical direction and a width W/x in the lateral direction.

8. The method of claim 7, wherein (iv) further includes:
forming a number x of openings in the hard mask layer to expose a portion of each of the step-platforms;
wherein a width of each opening substantially equals to n×m×W/T, in being a number of layers in each staircase to be formed and m being a number of staircases to be formed in each opening.

9. The method of claim 8, wherein (iii) further includes:
forming a polysilicon layer to cover top surfaces of the step-platforms as the hard mask layer.

10. The method of claim 8, wherein (vi) further includes:
patterning the photoresist layer to expose a portion of a top surface of each step-platform;
removing at least two top layers of the alternating layer stack exposed by the photoresist layer in each step-platform; and
trimming the photoresist layer to expose a larger portion of the top surface of each step-platform.

11. The method of claim 10, wherein (vi) further includes:
patterning the photoresist layer to expose a portion of a top surface of each step-platform, wherein a width of the portion substantially equals to n×W/T.

12. The method of claim 10, wherein (vi) further includes:
removing a first layer of the alternating layer stack in each step-platform by using the photoresist layer as a mask; and
removing a second layer of the alternating layer stack in each step-platform by using the first layer as a mask.

13. The method of claim 10, wherein (vi) further includes:
trimming the photoresist layer to expose a larger portion of the top surface of each step-platform, wherein a width of the larger portion substantially equals to $2n \times W/T$.

14. The method of claim 8, wherein (viii) further includes:
forming a second hard mask layer to cover top surfaces of the remaining alternating layer stack;
forming a plurality of second openings in the hard mask layer to expose a larger portion of each of the step-platforms;
forming a second photoresist layer to cover the exposed surfaces of the step-platforms and the second hard mask layer;
using a second same set of trim-etch processes to pattern the photoresist layer to form another set of staircases in each of the step-platforms; and
removing the second photoresist layer and the second hard mask layer.

15. The method of claim 14, wherein forming the plurality of second openings includes:
forming a number x of second openings in the second hard mask layer to expose a larger portion of each of the step-platforms;
wherein a width of each second opening substantially equals to $2n \times m \times W/T$.

\* \* \* \* \*